United States Patent
Okada et al.

(10) Patent No.: US 8,131,404 B2
(45) Date of Patent: Mar. 6, 2012

(54) TEMPERATURE REGULATING APPARATUS, EXPOSURE SYSTEM, AND DEVICE MANUFACTURING METHOD

(75) Inventors: Yoshiyuki Okada, Sakura (JP); Tomohiko Yoshida, Utsunomiya (JP); Takafumi Ota, Utsunomiya (JP); Yuuhei Matsumura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 298 days.

(21) Appl. No.: 12/498,264

(22) Filed: Jul. 6, 2009

(65) Prior Publication Data

US 2010/0004796 A1  Jan. 7, 2010

(30) Foreign Application Priority Data

Jul. 7, 2008 (JP) .................................. 2008-177406

(51) Int. Cl.
*G05D 23/00* (2006.01)
(52) U.S. Cl. ........................................................ 700/299
(58) Field of Classification Search .................... 700/299
See application file for complete search history.

(56) References Cited

U.S. PATENT DOCUMENTS 7,006,900 B2 * 2/2006 Zhenduo et al. .............. 700/299
(Continued)

FOREIGN PATENT DOCUMENTS

| JP | 2002-108408 A | 4/2002 |
| JP | 2005-332287 | 12/2005 |

OTHER PUBLICATIONS

"Thyristor" definition from Wikipedia; 8 pages; printed from Internet on Oct. 22, 2011.*

*Primary Examiner* — Ronald Hartman, Jr.
(74) *Attorney, Agent, or Firm* — Canon USA Inc. IP Division

(57) ABSTRACT

A temperature regulating apparatus which regulates temperature includes a heater, a temperature detector configured to detect temperature, a calculator configured to calculate a manipulated value based on an error between a target temperature and the temperature detected by the temperature detector, and a power controller configured to supply power, having one of a voltage and current controlled in accordance with the manipulated value, to the heater. The calculator includes a first calculator having at least a proportional element of the proportional element, an integral element, and a derivative element, and a second calculator configured to calculate a square root. The first calculator and the second calculator are coupled in series with each other.

8 Claims, 10 Drawing Sheets

U.S. PATENT DOCUMENTS

2004/0075140 A1* 4/2004 Baltes et al. .................. 257/347
2008/0001083 A1* 1/2008 Schaefer et al. ............. 250/290
2009/0310644 A1* 12/2009 Van De Kerkhof et al. .... 374/11

* cited by examiner

TEMPERATURE REGULATING APPARATUS, EXPOSURE SYSTEM, AND DEVICE MANUFACTURING METHOD

BACKGROUND OF THE INVENTION

1. Field of the Invention

The present invention relates to a temperature regulating apparatus, an exposure system including the temperature regulating apparatus, and a device manufacturing method using the exposure system.

2. Description of the Related Art

In recent years, it is demanded to attain both a high productivity and the formation of an ultrafine circuit pattern in the manufacture of devices such as semiconductor integrated circuit devices. To meet these demands, high-speed, high-accuracy alignment control is necessary. Alignment accuracy largely depends on the length measurement accuracy of a laser interferometer. To achieve an alignment accuracy on the order of nanometers, it is necessary to sufficiently suppress a fluctuation in the temperature of the interferometric optical path. For this reason, an exposure apparatus is supplied with a fluid, that is, a coolant, such as air or a liquid, whose temperature is regulated with high accuracy and which serves to suppress the influence of, for example, a change in the temperature of a clean room which accommodates the exposure apparatus and to remove heat generated in the exposure apparatus.

FIG. 10 is a block diagram showing the schematic arrangement of a conventional temperature regulating apparatus. A temperature detector 36 detects the temperature of air or a liquid serving as a fluid to regulate the temperature of an exposure apparatus. A compensation calculator 32 calculates the difference between a target temperature SP and the temperature detected by the temperature detector 36, and generates a manipulated value MV. A voltage detector 22 detects an AC voltage supplied from a commercial power supply 20. A voltage comparator 24 compares a reference voltage Vref and the voltage detected by the voltage detector 22, and generates a correction value Vcomp. A gain correcting unit 38 corrects the manipulated value MV, generated by the compensation calculator 32, based on the correction value Vcomp generated by the voltage comparator 24, and generates and supplies a manipulated value MVcomp to a power controller 28. The power controller 28 controls a power P, supplied to a heater 30, in accordance with the manipulated value MVcomp. With this operation, the temperature of the fluid supplied from the heater 30 to the exposure apparatus is regulated.

The power controller 28 includes, for example, a solid-state relay. The power controller 28 including a solid-state relay is energized to control the supply of an AC voltage to the heater 30 in accordance with the manipulated value MVcomp. The power consumption P of the heater 30 is given by:

$$P = (Vrm^2/R) \times (T1/T0) \quad (1)$$

where T0 is the prescribed period, T1 is the ON time of the heater 30, R is the resistance of the heater 30, and Vrm is the effective voltage of the AC voltage supplied from the commercial power supply 20.

Because the ON time T1 is controlled in accordance with the manipulated value MVcomp, the power consumption P of the heater 30 is controlled linearly with respect to the manipulated value MVcomp and, eventually, the manipulated value MV.

The correction value Vcomp generated by the voltage comparator 24 is given by:

$$Vcomp = (Vref/Vps)^2 \quad (2)$$

where Vps [V] is the AC voltage supplied from the commercial power supply 20, and MV [%] is the manipulated value generated by the compensation calculator 32.

Then, the manipulated value MVcomp calculated by the gain correcting unit 38 is given by:

$$MVcomp = Vcomp \times MV \times 10^{-2} \quad (3)$$

In this manner, a fluctuation in the power supply voltage is corrected in accordance with the square value of the ratio between the reference voltage Vref and the AC voltage supplied from the commercial power supply 20.

When high-accuracy/high-resolution control is necessary, a thyristor can be used as the power controller 28. Phase control of the power controller 28, which uses a thyristor, has a voltage control mode in which the voltage is controlled in accordance with the manipulated value, and a current control mode in which the current is controlled in accordance with the manipulated value. There is also a method of temperature regulation using a DC power supply in place of an AC power supply.

In an arrangement, such as a temperature regulating apparatus including a thyristor that constitutes a power controller, which controls a voltage or current, supplied from a power controller to a heater, linearly with respect to a manipulated value generated by a compensation calculator, the output from the heater is nonlinear with respect to the manipulated value. In this case, stable, high-accuracy temperature regulation is difficult to perform.

SUMMARY OF THE INVENTION

The present invention provides a technique advantageous for stable, high-accuracy temperature regulation.

One of the aspects of the present invention provides a temperature regulating apparatus which regulates temperature, having a heater, a temperature detector configured to detect temperature, a calculator configured to calculate a manipulated value based on an error between a target temperature and the temperature detected by the temperature detector, and a power controller configured to supply power, having one of a voltage and current controlled in accordance with the manipulated value, to the heater. The calculator includes a first calculator having at least a proportional element of the proportional element, an integral element, and a derivative element, and a second calculator configured to calculate a square root. The first calculator and the second calculator are coupled in series with each other.

Further features of the present invention will become apparent from the following description of exemplary embodiments with reference to the attached drawings.

DESCRIPTION OF THE EMBODIMENTS

Figure 1:
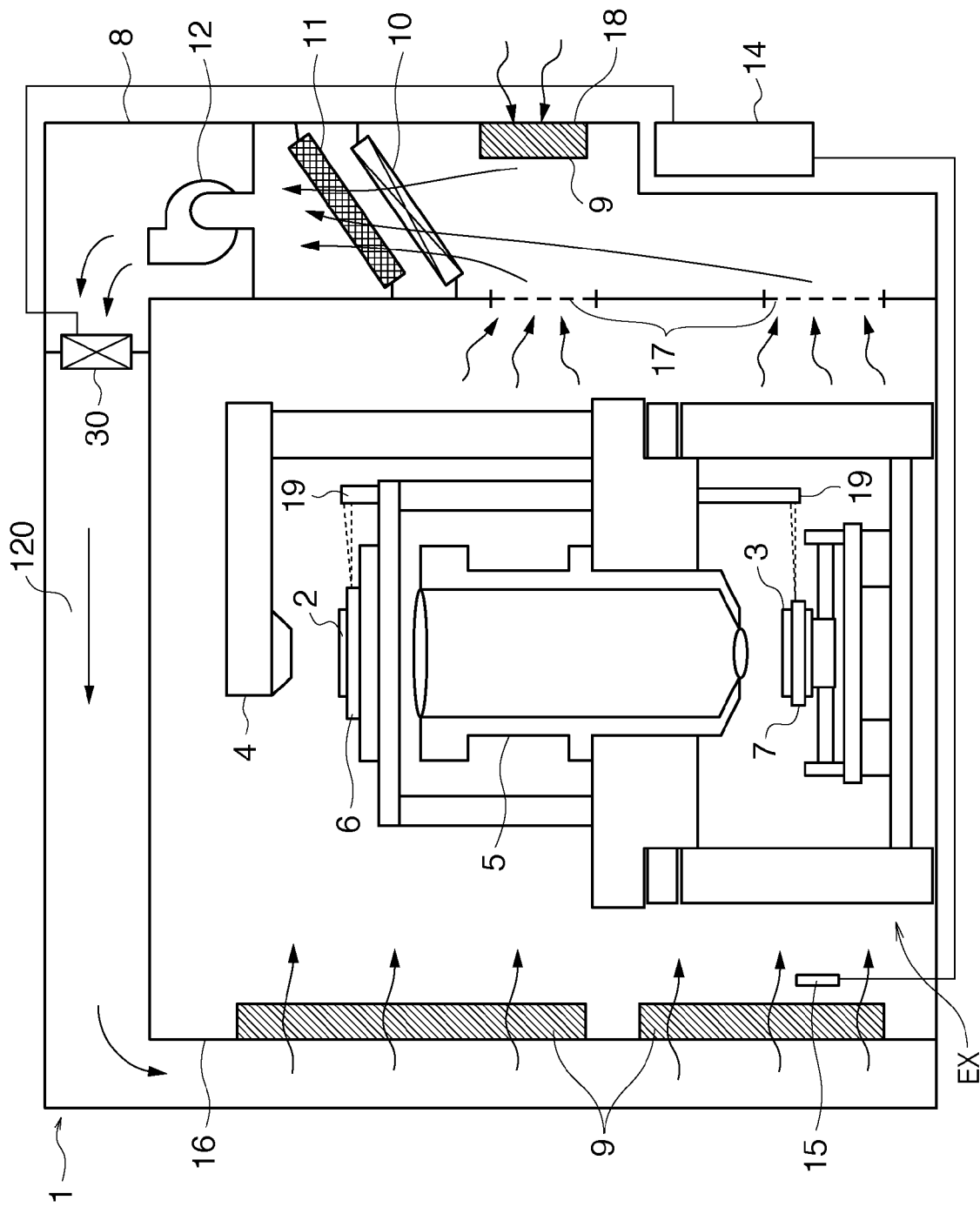
FIG. 1 is a view showing the schematic arrangement of an exposure system according to the first, second, and third embodiments of the present invention.

Exemplary embodiments of the present invention will be described below with reference to the accompanying drawings.

A first embodiment of the present invention will be described below referring to the drawings. The arrangement of an exposure apparatus to which a temperature regulating method according to the present invention is applicable will be explained first with reference to FIG. 1.

FIG. 1 is a view showing the schematic arrangement of an exposure system according to an exemplary embodiment of the present invention. The exposure system includes an exposure apparatus EX which projects the pattern of a reticle (original) 2 onto a wafer (substrate) 3 by a projection optical system 5 to expose the wafer 3. The wafer 3 is coated with a photoresist, on which a latent image is formed by exposure. The exposure apparatus EX is accommodated inside a booth 16.

A light beam is supplied from a light source (not shown) to an illumination optical system 4. The illumination optical system 4 illuminates the reticle 2 with the supplied light. The pattern of the reticle 2 illuminated is projected onto the wafer 3 by the projection optical system 5. The light source can include, for example, a superhigh pressure mercury lamp and optical members such as an elliptical mirror and a lens. Alternatively, the light source can include an excimer laser and an optical system which shapes the laser beam into a predetermined shape.

A reticle stage mechanism 6 aligns the reticle 2. A wafer stage mechanism 7 aligns the wafer 3. The positions of a stage in the reticle stage mechanism 6 and a wafer stage in the wafer stage mechanism 7 are measured with high accuracy by a laser interferometer 19, and these stages are aligned based on the obtained measurement results.

The temperature of the exposure apparatus EX is regulated using a chamber 1 surrounding the exposure apparatus EX. The chamber 1 includes an air-conditioning machine room 8, a dust collection filter 9, and the booth 16. The air-conditioning machine room 8 mainly regulates the temperature of a fluid 120 such as air. The dust collection filter 9 filters out minute foreign particles in the fluid 120 to form a uniform stream of the cleaned fluid 120. The booth 16 shields the environment of the main body of the exposure apparatus EX from outside. In the chamber 1, the fluid 120 whose temperature is regulated by a cooler 10 and reheating heater 30 accommodated in the air-conditioning machine room 8 is supplied into the booth 16 through a chemical filter 11 and the dust collection filter 9 by a blower 12. The fluid 120 supplied into the booth 16 is taken into the air-conditioning machine room 8 again through a return port 17, and circulates through a circulation route including the chamber 1. A temperature sensor 15 detects the temperature of the fluid 120 supplied into the booth 16 and sends the detected result to a controller 14 that controls the heater 30.

In general, a precise circulation route is not formed. Instead, to maintain the internal space of the booth 16 at a positive pressure, about ten percent of the amount of circulating air is guided into the internal space of the booth 16 through the blower 12 by an external air intake 18 formed in the air-conditioning machine room 8 from outside the booth 16. In an arrangement which cools down any heat source of the exposure apparatus EX by forcedly exhausting the air inside the booth 16, external air in an amount matching the exhaust flow rate is introduced into the booth 16. The purpose of maintaining the internal space of the booth 16 at a positive pressure is to prevent any minute foreign particles and harmful gases from entering the interior of the booth 16 from outside the booth 16 through minute gaps in the booth 16. In this way, the chamber 1 has a function of keeping the environment surrounding the exposure apparatus EX at a predetermined temperature and the fluid 120 clean.

Figure 2:
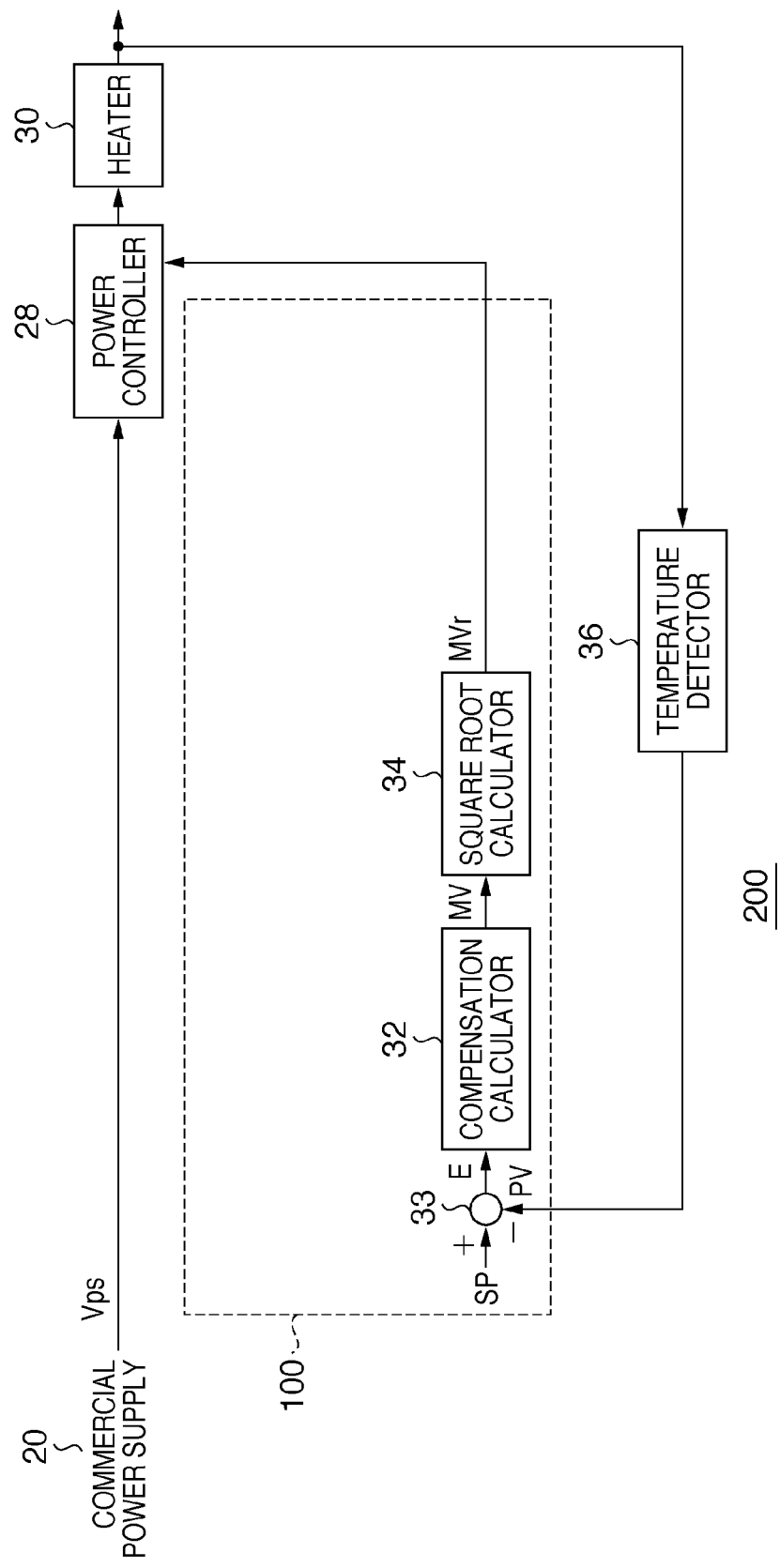
FIG. 2 is a block diagram showing the schematic arrangement of a temperature regulating apparatus according to the first embodiment of the present invention.

FIG. 2 is a block diagram showing the schematic arrangement of a temperature regulating apparatus 200 built in the exposure system shown in FIG. 1. The temperature regulating apparatus 200 includes the heater 30, a temperature detector 36, a calculator 100, and a power controller 28, and regulates the temperature of the fluid 120 by controlling the power supplied from the power controller 28 to the heater 30. Although an example in which a gas such as air is used as the fluid 120 will be explained in this embodiment, an exposure system can also be configured such that a liquid is used as the fluid 120. The temperature detector 36 may include the temperature sensor 15 shown in FIG. 1. The calculator 100 and the power controller 28 may constitute the controller 14 shown in FIG. 1.

The temperature detector 36 detects the temperature of the fluid 120 to regulate the temperature of the exposure apparatus EX. The calculator 100 calculates a manipulated value MVr based on an error E between a target temperature SP and a temperature PV detected by the temperature detector 36. The power controller 28 supplies a power, having a voltage or current controlled in accordance with the manipulated value MVr, to the heater 30. The calculator 100 includes a compensation calculator (first calculator) 32 which multiplies the error E by at least a proportional element of the proportional element, an integral element, and a derivative element, and a square root calculator (second calculator) 34 which calculates a square root. Note that the compensation calculator (first calculator) 32 and the square root calculator (second calculator) 34 are coupled in series with each other.

The calculator 100 also includes an error calculator 33 which calculates the difference (error) between the target temperature SP and the temperature PV detected by the temperature detector 36. In this embodiment, the compensation calculator (first calculator) 32 is arranged in the subsequent stage of the error calculator 33, and the square root calculator (second calculator) 34 is arranged in the subsequent stage of the compensation calculator (first calculator) 32. In another embodiment, the compensation calculator 32 may be arranged in the subsequent stage of the square root calculator 34.

The compensation calculator 32 can be configured to multiply the error E by a proportional element, a proportional element and integral element, a proportional element and derivative element, or a proportional element, integral element, and derivative element.

In this embodiment, the compensation calculator 32 performs the calculation using the error E as an input, and generates a manipulated value (first manipulated value) MV. Also, the square root calculator 34 calculates the square root of the manipulated value MV, and generates a manipulated value MVr. The manipulated value MVr is supplied to the power controller 28.

Upon receiving the power supplied from a commercial power supply 20 serving as an AC power supply, the power controller 28 supplies a power P, having a voltage or current controlled in accordance with the manipulated value MVr, to the heater 30. The power controller 28 includes, for example, a thyristor and controls the power P by thyristor phase control.

A power controller using a solid-state relay has a prescribed period T0 of about 1 sec. On the other hand, a power controller using a thyristor has an AC power supply period of, for example, 16.7 ms to 20 ms and therefore has a high resolution, and this allows high-accuracy power control.

The manipulated value MVr is given by:

$$MVr=\sqrt{(MV)} \quad (4)$$

where Vps [V] is the AC voltage supplied from the commercial power supply 20 serving as an AC power supply, and MV [%] is the manipulated value generated by the compensation calculator 32.

Phase control of the power controller 28 which uses a thyristor has a voltage control mode in which the voltage is controlled in accordance with the input manipulated value, and a current control mode in which the current is controlled in accordance with the input manipulated value. In the voltage control mode, in accordance with the manipulated value MVr, the power controller 28 outputs a voltage Vout given by:

$$Vout=Vps \times MVr \times 10^{-1} \quad (5)$$

In the current control mode, in accordance with the manipulated value MVr, the power controller 28 outputs a current Iout given by:

$$Iout=Ips \times MVr \times 10^{-1} \quad (6)$$

Letting R be the resistance of the heater 30, the power consumption P of the heater 30 is given by:

$$P=Vout^2/R=Iout^2 \times R \quad (7)$$

Then, from equations (4), (5), (6), and (7), we have:

$$P=Vps^2 \times MV \times 10^{-2}/R \quad (8)$$

$$P=Ips^2 \times MV \times 10^{-2} \times R \quad (9)$$

Figure 3:
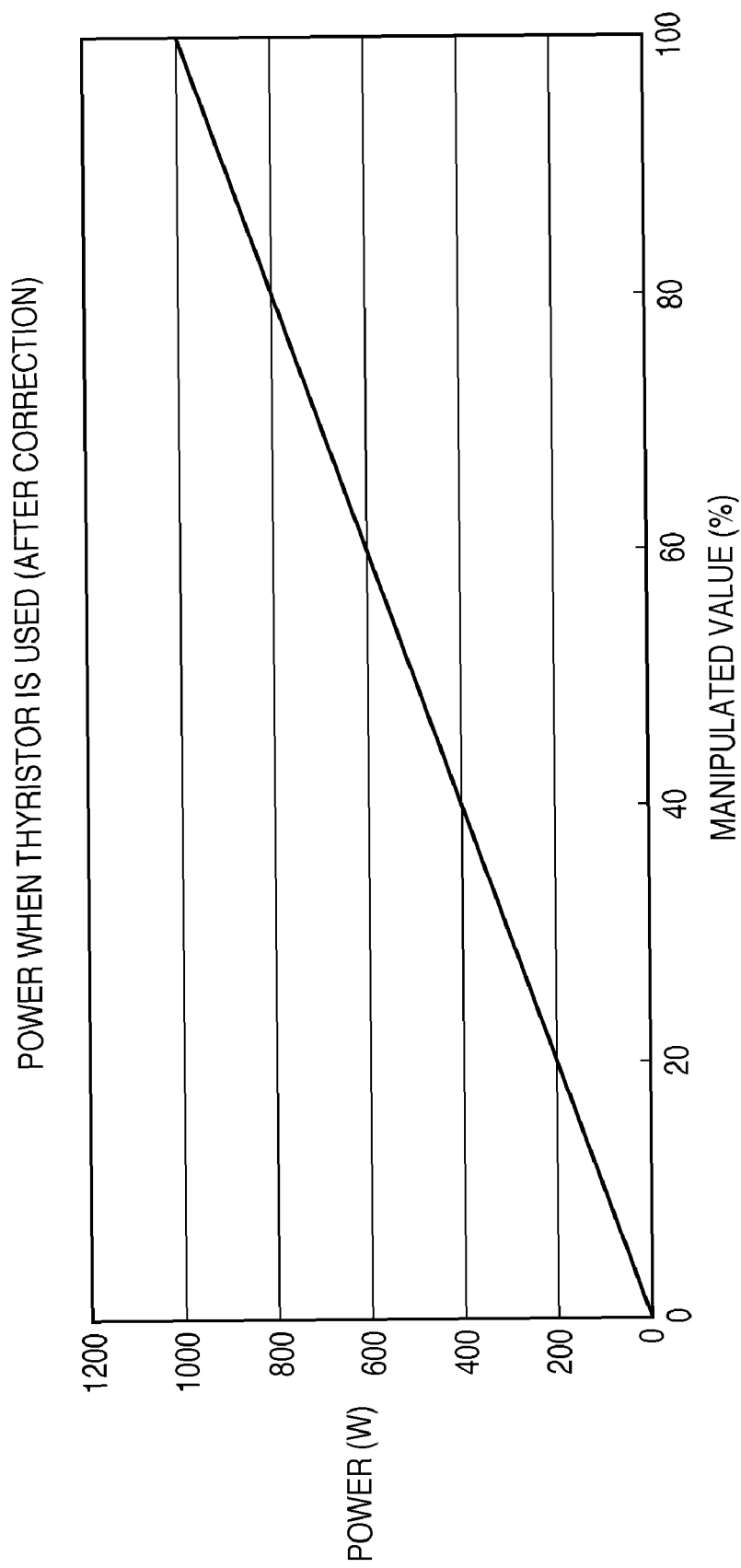
FIG. 3 is a graph illustrating the power characteristic of temperature regulating apparatuses according to the first, second, and third embodiments of the present invention.

FIG. 3 is a graph showing the relationship between the manipulated value MV and the power consumption P of the heater 30 when the AC voltage Vps is 200 [V] and the resistance R of the heater 30 is 40 [Ω].

The relationship between the power consumption P (i.e., the calorific value) and the manipulated value MV generated by the compensation calculator 32 can be made linear by calculating the square root of the manipulated value MV generated by the compensation calculator 32 and determining a new manipulated value MVr. Note that FIG. 3 shows an example in which the power consumption P is 0 [W] for a manipulated value MV of 0 [%] and is 1,000 [W] for a manipulated value MV of 100 [%].

A gain G representing the relationship between the manipulated value MV and the power consumption P of the heater 30 when correction which exploits square root calculation is performed is the ratio between the manipulated value MV and the power consumption P:

$$G=P/MV \quad (10)$$

Substituting equation (8) into equation (10) yields:

$$G=Vps^2 \times 10^{-2}/R \quad (11)$$

Figure 4:
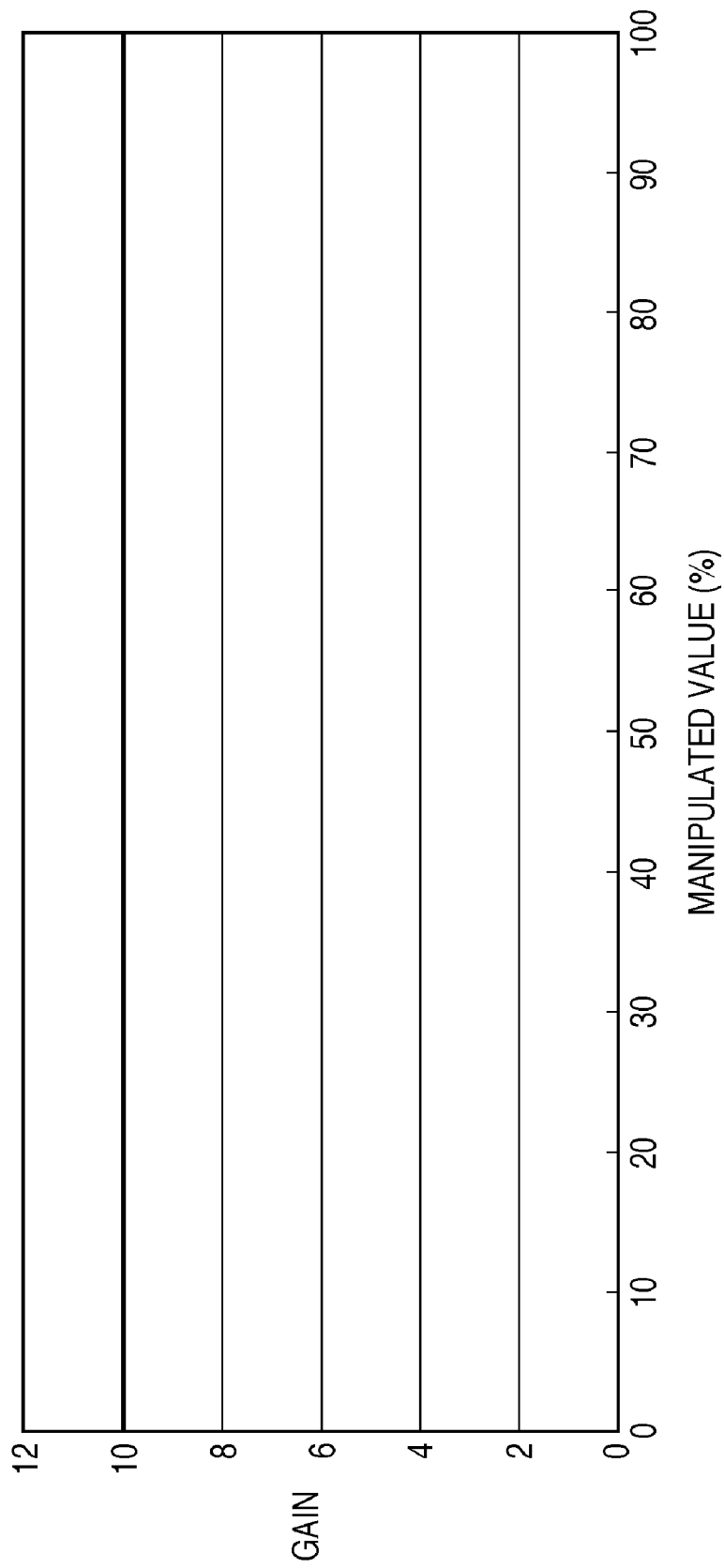
FIG. 4 is a graph illustrating the gain characteristic of the temperature regulating apparatuses according to the first, second, and third embodiments of the present invention.

FIG. 4 shows the relationship between the manipulated value MV and the gain G when the AC voltage Vps is 200 [V] and the resistance R of the heater 30 is 40 [Ω]. FIG. 4 reveals that the gain G of the power consumption P is constant with respect to the manipulated value MV. That is, a temperature regulating apparatus including a power controller 28 which operates in the voltage control mode or the current control mode corrects, by linearization which exploits square root calculation, nonlinearity of the power consumption P of the heater 30 with respect to the manipulated value MV generated by the compensation calculator 32. In this case, the influence of disturbance is small and the response speed is constant, and this allows stable temperature regulation.

For the purpose of comparison, a power consumption P of the heater 30 when correction which exploits square root calculation is not performed is calculated in the following way. Note that an arrangement in which correction which exploits square root calculation is not performed corresponds to that obtained by removing the square root calculator 34 from that shown in FIG. 2.

A voltage Vout and current Iout output from the power controller 28 are given by:

$$Vout=Vps \times MV \times 10^{-2} \quad (12)$$

$$Iout=Ips \times MV \times 10^{-2} \quad (13)$$

where Vps [V] is the AC voltage, and MV [%] is the manipulated value generated by the compensation calculator 32.

A power consumption P of the heater 30 is given by equation (7). Then, substituting (12) and (13) into equation (7) yields:

$$P=Vps^2 \times MV^2 \times 10^{-4}/R \quad (14)$$

$$P=Ips^2 \times MV^2 \times 10^{-4} \times R \quad (15)$$

Figure 5:
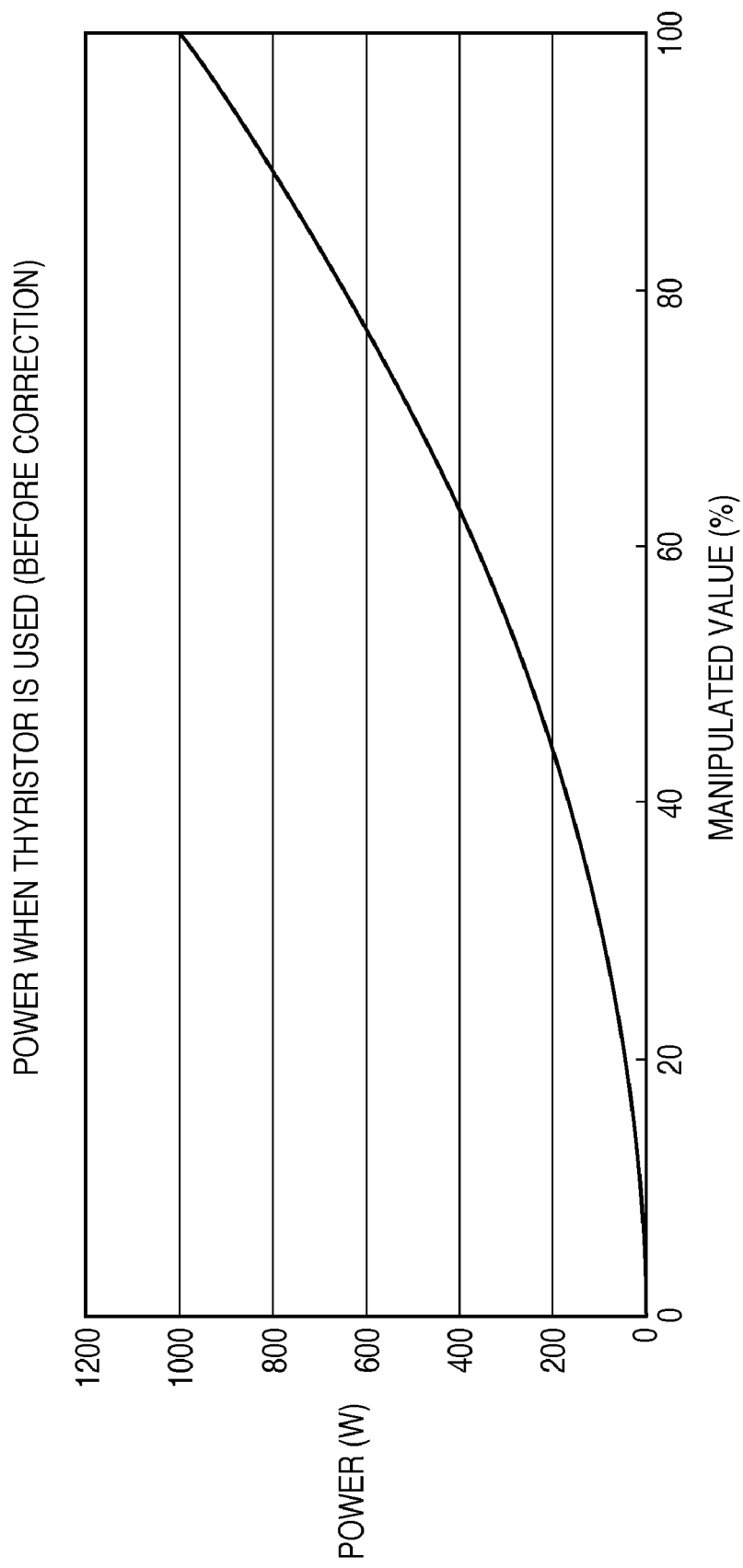
FIG. 5 is a graph illustrating the power characteristic of the temperature regulating apparatus in a comparative example.

FIG. 5 shows the relationship between the manipulated value MV and the power consumption P of the heater 30 when the AC voltage Vps is 200 [V] and the resistance R of the heater 30 is 40 [Ω] in an arrangement in which correction which exploits square root calculation is not performed. When correction which exploits square root calculation is not performed, the power consumption P of the heater 30 is nonlinear with respect to the manipulated value MV generated by the compensation calculator 32, as shown in FIG. 5.

Also, a gain G representing the relationship between the manipulated value MV and the power consumption P of the heater 30 when correction which exploits square root calculation is not performed is the derivative of equation (14) with respect to the manipulated value MV:

$$G=Vps^2 \times 2MV \times 10^{-4}/R \quad (16)$$

Figure 6:
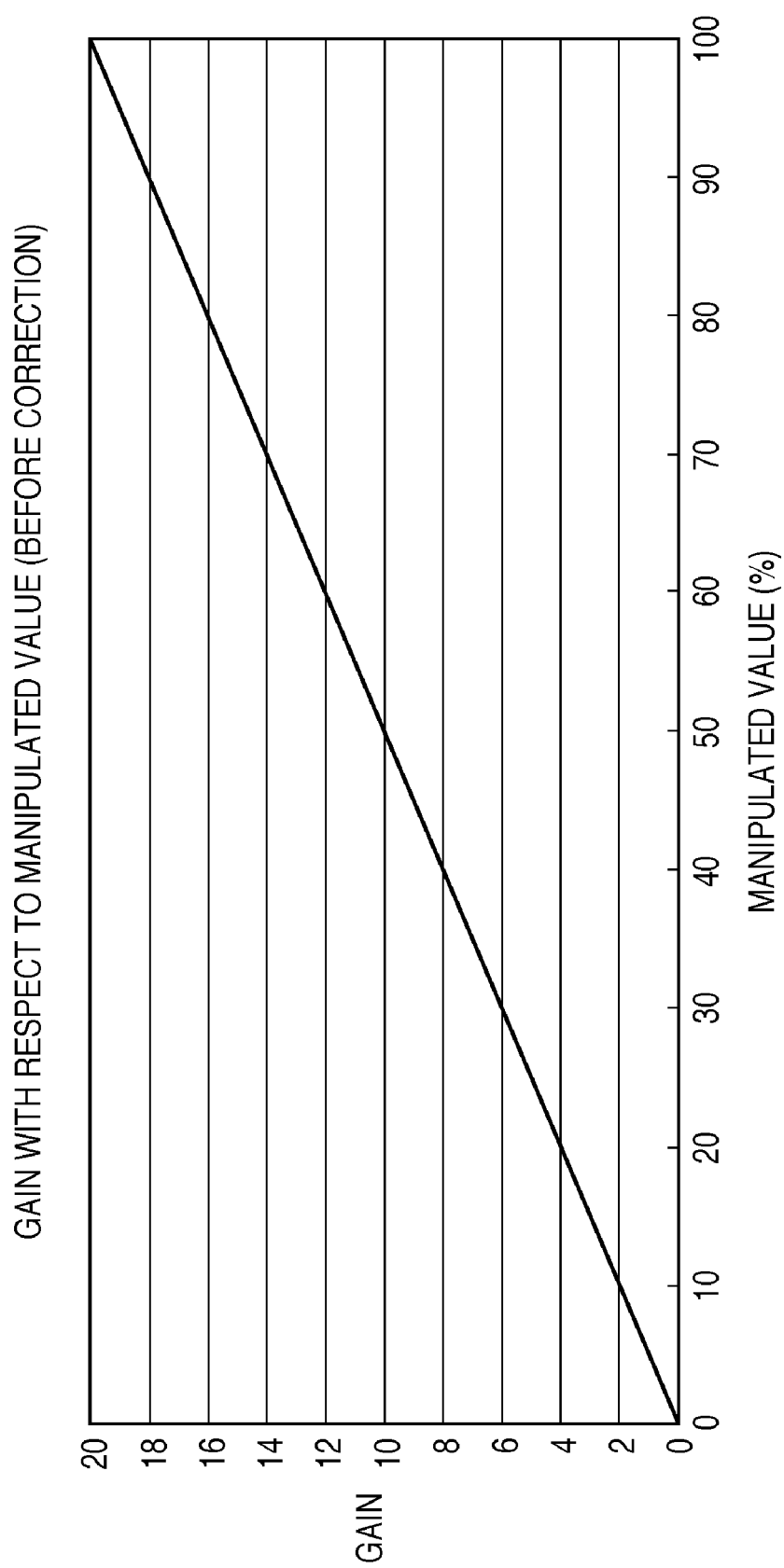
FIG. 6 is a graph illustrating the gain characteristic of the temperature regulating apparatus in a comparative example.

FIG. 6 shows the relationship between the manipulated value MV and the gain G when the AC voltage Vps is 200 [V] and the resistance R of the heater 30 is 40 [Ω] in an arrangement in which correction which exploits square root calculation is not performed. Gains G when the manipulated value MV generated by the compensation calculator 32 is 10 [%] and 90 [%] are given by:

<for Manipulated Value MV of 10 [%]>

$$G=40000 \times 2 \times 10 \times 10^{-4}/40=2 \quad (17)$$

<for Manipulated Value MV of 90 [%]>

$$G = 40000 \times 2 \times 90 \times 10^{-4}/40 = 18 \tag{18}$$

Equations (17) and (18) reveal a gain change of nine times. That is, the gain G is not constant within the entire range of the manipulated value MV, as shown in FIG. 6, and this makes stable temperature regulation impossible. That is, the power consumption P of the heater 30 is nonlinear with respect to the manipulated value MV of the power controller 28 in the voltage control mode or the current control mode. In the range in which the manipulated value MV is small, the gain G is also small and therefore the influence of disturbance is large. Furthermore, the response speed is low, and this makes stable temperature regulation impossible. In contrast, in the range in which the manipulated value MV is large, the response may oscillate although its speed is high, and this also leads to unstable temperature regulation.

In contrast to this, in this embodiment, the manipulated value MV and the power consumption P can be controlled to have a proportional relationship (linear relationship) by calculating the square root of the manipulated value MV generated by the compensation calculator 32. This makes it possible to keep the gain G constant with respect to the manipulated value MV, allowing stable temperature regulation.

In regulating the temperature of the exposure apparatus EX by a temperature regulating apparatus 200 including a power controller 28 which controls a voltage or a current, and a heater 30 including a resistor, nonlinearity of the power controller 28 is corrected, and this allows stable temperature regulation.

Likewise, when the power controller 28 controls a DC voltage or a DC current in accordance with the manipulated value, the manipulated value MVr corrected by the square root calculation shown in equation (4) can be calculated and supplied to the power controller 28. This makes it possible to control the manipulated value MV and the power consumption P of the heater 30 to have a proportional relationship, allowing stable temperature regulation.

Figure 7:
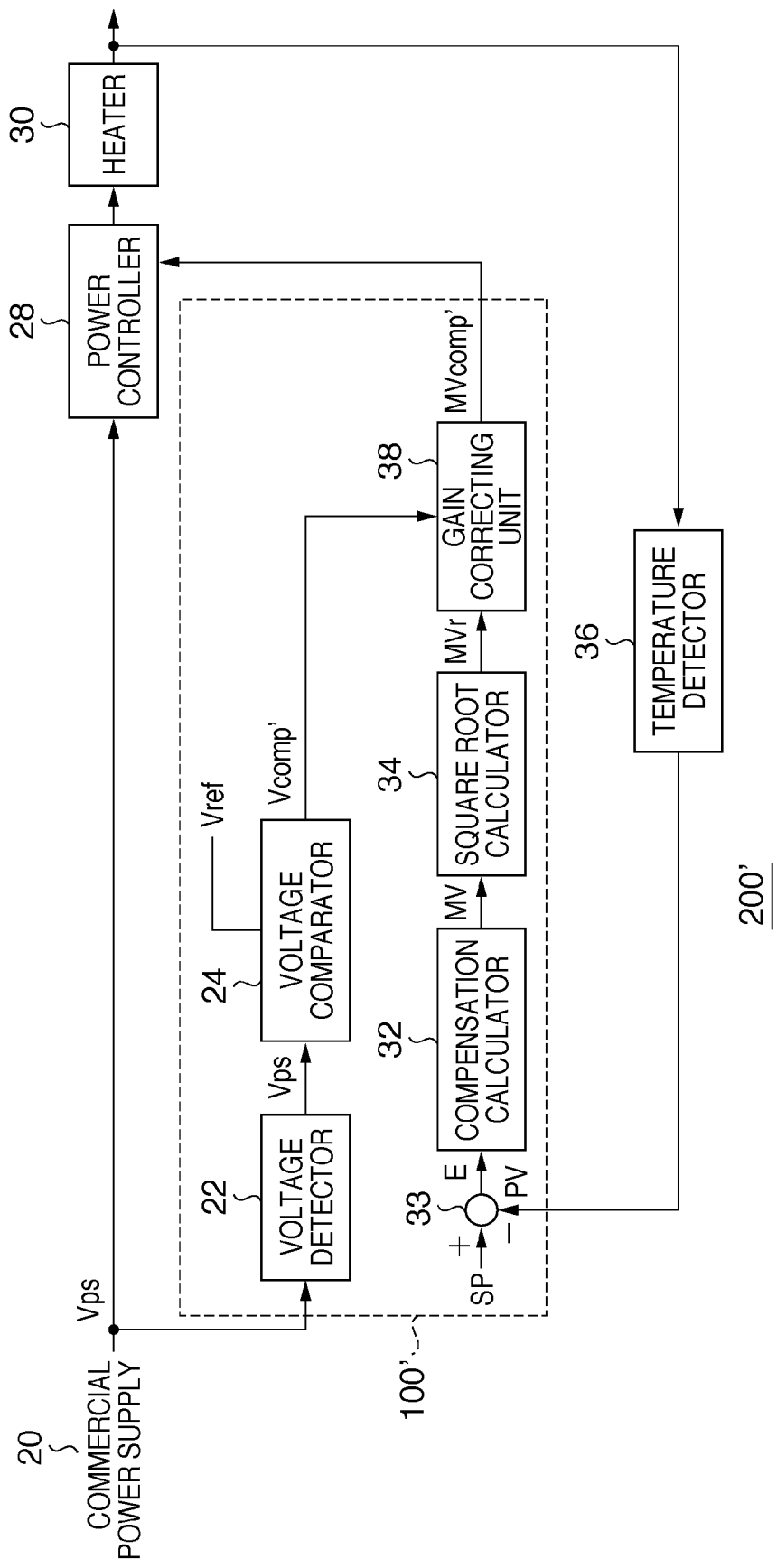
FIG. 7 is a block diagram showing the schematic arrangement of a temperature regulating apparatus according to the second embodiment of the present invention.
Figure 10:
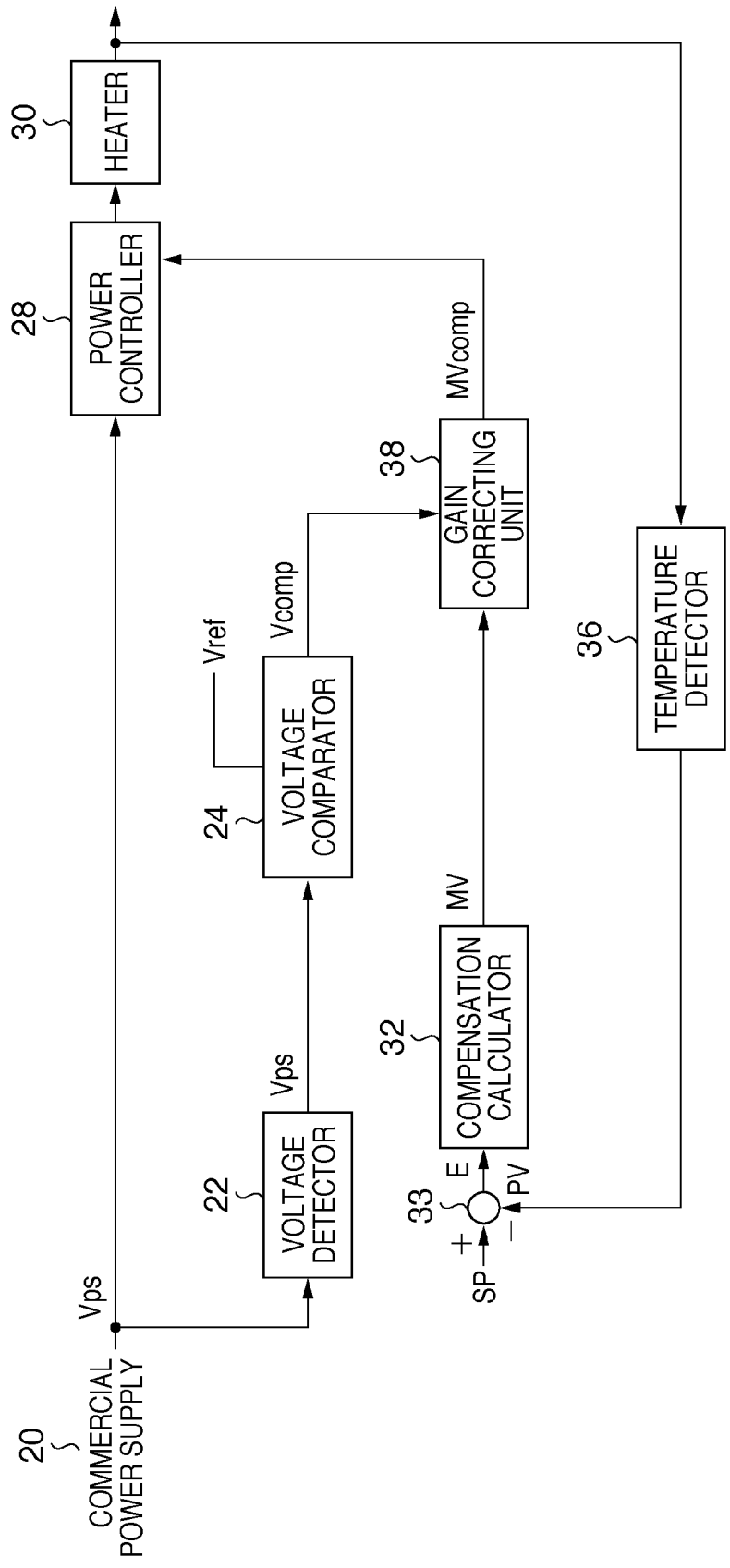
FIG. 10 is a block diagram showing the schematic arrangement of a conventional temperature regulating apparatus.

A second embodiment of the present invention will be described below referring to the drawings. FIG. 7 is a block diagram showing the schematic arrangement of a temperature regulating apparatus 200' built in the exposure system shown in FIG. 1. In this embodiment, the temperature regulating apparatus 200 shown in FIG. 2 is replaced with the temperature regulating apparatus 200' shown in FIG. 7. Note that the same reference numerals as in FIG. 2 or 10 denote virtually the same constituent elements in FIG. 7.

In the second embodiment, a calculator 100' of the temperature regulating apparatus 200' has a circuitry obtained by adding a voltage detector 22, a voltage comparator (third calculator) 24, and a gain correcting unit (fourth calculator) 38 to the calculator 100 in the first embodiment. The voltage comparator (third calculator) 24 compares a reference voltage Vref and the voltage detected by the voltage detector 22, and generates a voltage correction value Vcomp'.

A compensation calculator (first calculator) 32 multiplies an error E by at least a proportional element of the proportional element, an integral element, and a derivative element, and generates a manipulated value (first manipulated value) MV. A square root calculator (second calculator) 34 calculates the square root of the manipulated value (first manipulated value) MV generated by the compensation calculator 32, and generates a manipulated value (second manipulated value) MVr.

The gain correcting unit (fourth calculator) 38 corrects the manipulated value (second manipulated value) MV, generated by the square root calculator 34, based on the correction value Vcomp' supplied from the voltage comparator 24, and generates a manipulated value MVcomp'.

The correction value Vcomp' generated by the voltage comparator 24 is given by:

$$Vcomp' = (Vref/Vps) \tag{19}$$

where Vps [V] is the AC voltage supplied from a commercial power supply 20, and MV [%] is the manipulated value generated by the compensation calculator 32.

Then, the manipulated value MVcomp' calculated by the gain correcting unit 38 is given by:

$$MVcomp' = Vcomp' \times MVr \times 10^{-1} \tag{20}$$

In the voltage control mode, in accordance with the manipulated value MVcomp', a power controller 28 outputs a voltage Vout given by:

$$Vout = Vps \times MVcomp' \tag{21}$$

In the current control mode, in accordance with the manipulated value MVcomp', the power controller 28 outputs a current Iout given by:

$$Iout = Ips \times MVcomp' \tag{22}$$

Letting R be the resistance of the heater 30, a power consumption P of the heater 30 is given by equation (7). Then, from equations (7), (20), (21), and (22), we have:

$$P = Vps^2 \times Vcomp'^2 \times MV \times 10^{-2}/R \tag{23}$$

$$P = Ips^2 \times Vcomp'^2 \times MV \times 10^{-2} \times R \tag{24}$$

Using equations (19), (20), (21), and (23), power consumptions P of the heater 30 when the AC voltage Vps is 200 [V] and 180 [V] are calculated herein. The calculation results are as follows:

<for AC voltage Vps of 200 [V]>
correction value Vcomp'=1
manipulated value MVcomp'≈0.71
output voltage Vout≈141.42 [V]
power consumption P=500 [W]
<for AC voltage Vps of 180 [V]>
correction value Vcomp'≈1.11
manipulated value MVcomp≈0.79
output voltage Vout≈141.42 [V]
power consumption P=500 [W]

Note that the reference voltage Vref, the resistance R of the heater 30, and the manipulated value MV are assumed to be 200 [V], 40 [Ω], and 50 [%], respectively.

The above-mentioned calculation results reveal that the power consumption P of the heater 30 stays constant regardless of a fluctuation in the voltage supplied to the power controller 28.

Even when the voltage of the commercial power supply 20 serving as an AC power supply has fluctuated, the correction value Vcomp' shown in equation (19) can serve to control the power consumption P of the heater 30 to be constant, and this allows stable temperature regulation.

A power consumption P of the heater 30 when voltage correction is not performed is calculated herein. This corresponds to a power consumption P in an arrangement which does not include a voltage detector 22, a voltage comparator 24, and a gain correcting unit 38, that is, the arrangement in the first embodiment shown in FIG. 2.

Power consumptions P of the heater 30 for a manipulated value MV 50 [%] when the AC voltage Vps is 200 [V] and the resistance R of the heater 30 is 40 [Ω] and when the AC voltage Vps is 180 [V] and the resistance R of the heater 30 is 40 [Ω] are calculated in accordance with equation (8). The calculation results are as follows:

<for AC voltage Vps of 200 [V]>
voltage Vout≈141.42 [V]
power consumption P=500 [W]
<for AC voltage Vps of 180 [V]>
voltage Vout≈127.28 [V]
power consumption P=405 [W]

Figure 8:
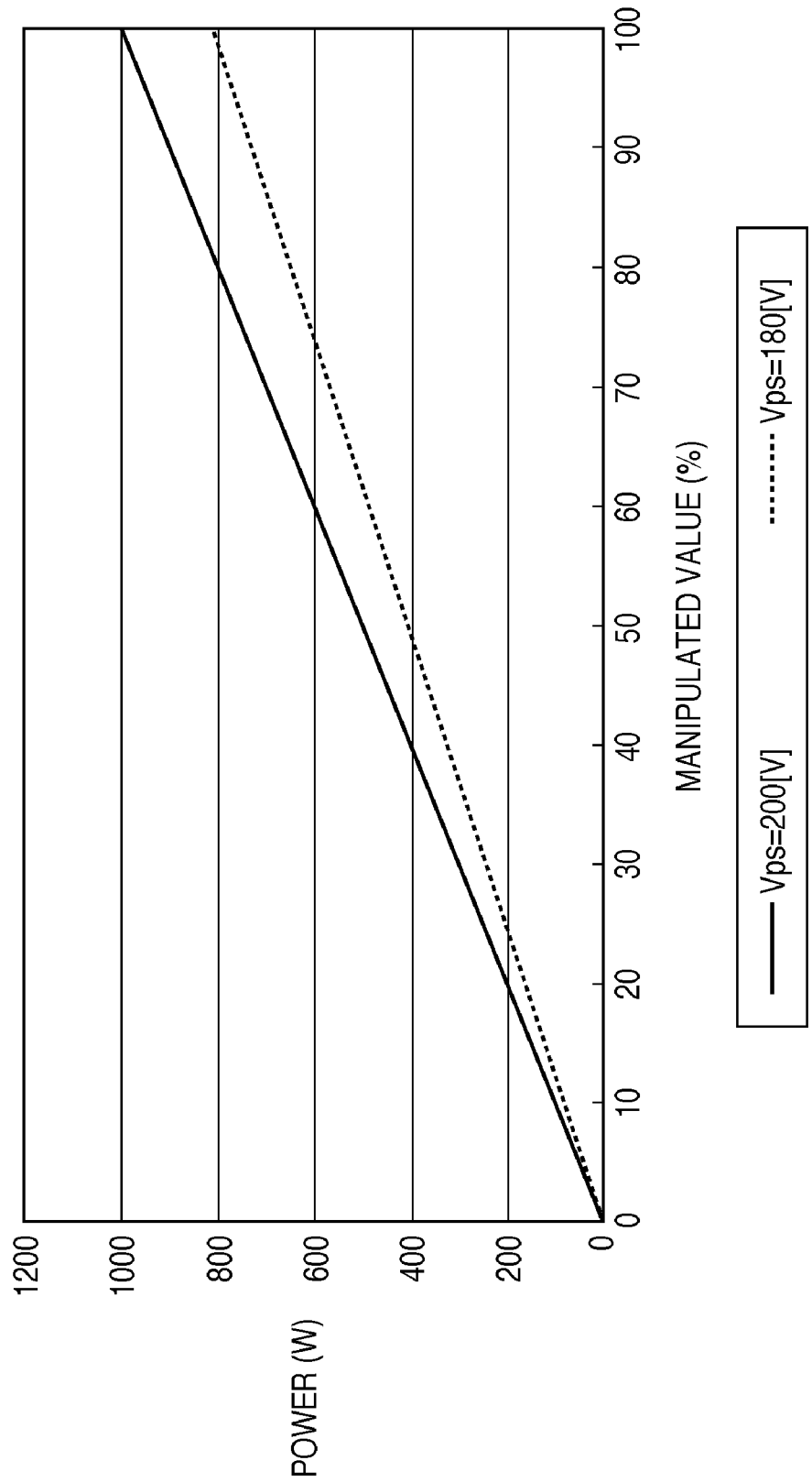
FIG. 8 is a graph illustrating the power characteristic of the temperature regulating apparatus upon a fluctuation in the power supply voltage in a comparative example.

FIG. 8 shows the relationship between the manipulated value MV and the power consumption P when voltage correction is not performed. FIG. 8 and the above-mentioned calculation example reveal that the power consumption P of the heater 30 changes by about 20% as the voltage supplied to the power controller 28 changes by 10%, and this makes stable temperature regulation impossible.

According to this embodiment, the power consumption P of the heater 30 can be controlled to be constant regardless of a fluctuation in the power supply voltage by correcting the manipulated value MVr based on the ratio between the reference voltage Vref and the power supply voltage supplied to the power controller 28, and this allows stable temperature regulation.

In regulating the temperature of the exposure apparatus EX by a temperature regulating apparatus 200' including a power controller 28 which controls a voltage or a current, and a heater 30 including a resistor, the influence of a fluctuation in the power supply voltage on the regulation is corrected, and this allows stable temperature regulation.

Figure 9:
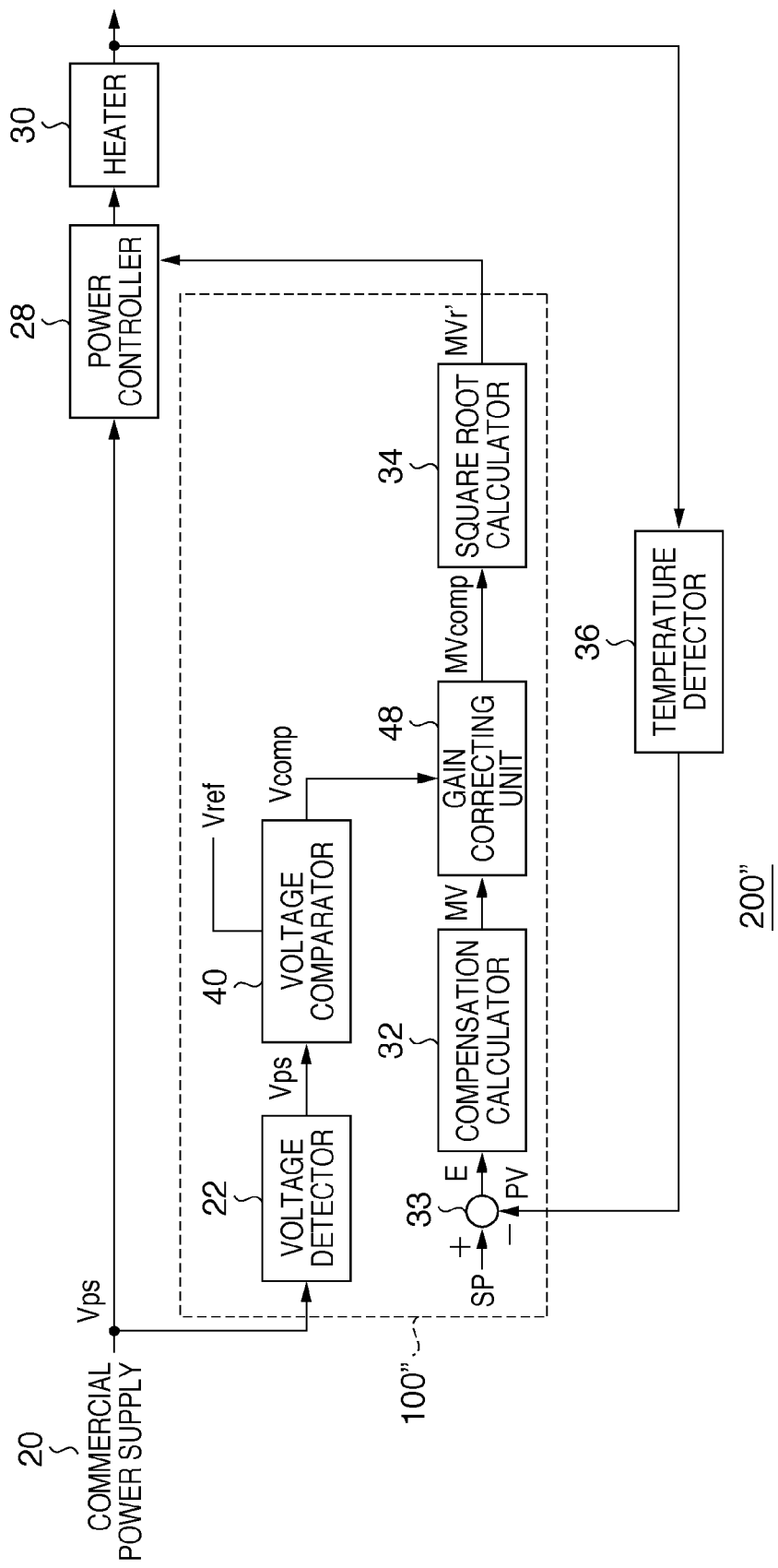
FIG. 9 is a block diagram showing the schematic arrangement of a temperature regulating apparatus according to the third embodiment of the present invention.

A third embodiment of the present invention will be described below referring to the drawings. FIG. 9 is a block diagram showing the schematic arrangement of a temperature regulating apparatus 200" built in the exposure system shown in FIG. 1. In this embodiment, the temperature regulating apparatus 200 shown in FIG. 2 is replaced with the temperature regulating apparatus 200" shown in FIG. 9. Note that the same reference numerals as in FIG. 2 or 10 denote virtually the same constituent elements in FIG. 9.

In the third embodiment, a calculator 100" of the temperature regulating apparatus 200" has a circuitry obtained by adding a voltage detector 22, a voltage comparator (third calculator) 40, and a gain correcting unit (fourth calculator) 48 to the calculator 100 in the first embodiment.

The calculator 100" in the third embodiment is different from the calculator 100' in the second embodiment in that a square root calculator (second calculator) 34 is arranged in the subsequent stage of the gain correcting unit (fourth calculator) 48. With this arrangement, the calculation details of the voltage comparator (third calculator) 40 and gain correcting unit (fourth calculator) 48 in the third embodiment differ from those of the voltage comparator (third calculator) 24 and gain correcting unit (fourth calculator) 38 in the second embodiment.

A correction value Vcomp [V] generated by the voltage comparator 40 is given by:

$$Vcomp=(Vref/Vps)^2 \qquad (25)$$

That is, the voltage comparator 40 calculates, as a correction value Vcomp, the square of the ratio between a reference voltage Vref and an AC voltage Vps supplied to a power controller 28.

A manipulated value (second manipulated value) MVcomp generated by the gain correcting unit 48 is given by:

$$MVcomp=Vcomp \times MV*10^{-2} \qquad (26)$$

where MV [%] is the manipulated value (first manipulated value) generated by a compensation calculator 32, and Vcomp [V] is the correction value generated by the voltage comparator 40.

A manipulated value MVr' generated by the square root calculator 34 is given by:

$$MVr'=\sqrt{(MVcomp)} \qquad (27)$$

In the voltage control mode, in accordance with the manipulated value MVr', the power controller 28 outputs a voltage Vout given by:

$$Vout=Vps \times MVr' \qquad (28)$$

In the current control mode, in accordance with the manipulated value MVr', the power controller 28 outputs a current Iout given by:

$$Iout=Ips \times MVr' \qquad (29)$$

A power consumption P of a heater 30 is given by equation (7). Then, from equations (7), (26), (27), (28), and (29), we have:

$$P=Vps^2 \times Vcomp \times MV \times 10^{-2}/R \qquad (30)$$

$$P=Ips^2 \times Vcomp \times MV \times 10^{-2} \times R \qquad (31)$$

Using equations (25), (26), (27), (28), and (30), power consumptions P of the heater 30 when the AC voltage Vps is 200 [V] and 180 [V] are calculated herein. The calculation results are as follows:

<for AC voltage Vps of 200 [V]>
correction value Vcomp=1
manipulated value MVcomp≈0.5
manipulated value MVr'≈0.71
output voltage Vout≈141.42 [V]
power consumption P=500 [W]
<for AC voltage Vps of 180 [V]>
correction value Vcomp≈1.23
manipulated value MVcomp≈0.62
manipulated value MVr≈0.79
output voltage Vout≈141.42 [V]
power consumption P=500 [W]

Note that the reference voltage Vref, the resistance R of the heater 30, and the manipulated value MV are assumed to be 200 [V], 40 [Ω], and 50 [%], respectively.

The above-mentioned calculation results reveal that the power consumption P of the heater 30 stays constant regardless of a fluctuation in the voltage supplied to the power controller 28.

Even when the conventional correction method is used as a method of calculating a correction value Vcomp, the power consumption P of the heater 30 can be controlled to be constant, regardless of a fluctuation in the voltage supplied to the power controller 28, by providing a square root calculator 34 in the subsequent stage of the gain correcting unit 48. This allows stable temperature regulation by the temperature regulating apparatus 200".

In regulating the temperature of an exposure apparatus EX by a temperature regulating apparatus 200" including a power controller 28 which controls a voltage or a current, and a heater 30 including a resistor, the influence of a fluctuation in the power supply voltage on the regulation is corrected, and this allows stable temperature regulation.

[Modifications]

In place of a thyristor, a Peltier device, for example, can be used as a power controller 28 in the heating mode.

A metal heating element, a refractory metal heating element, or a nonmetal heating element, for example, is suitable as a resistor which generates Joule heat and is used as a heater

30. From the structural viewpoint of the heater 30, a sheathed heater or a quartz heater, for example, is suitable.

[Device Manufacturing Method]

A device manufacturing method according to a preferred embodiment of the present invention is suitable for manufacturing, for example, a semiconductor device and a liquid crystal device. This method can include, for example, a step of transferring the pattern of an original onto a photoresist applied on a substrate using the above-mentioned exposure system, and a step of developing the photoresist. The devices are manufactured by further other known steps (e.g., etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-177406, filed Jul. 7, 2008, which is hereby incorporated by reference herein in its entirety.

What is claimed is:

1. A temperature regulating apparatus which regulates temperature, the apparatus comprising:
   a heater:
   a temperature detector configured to detect temperature;
   a calculator configured to calculate a manipulated value based on an error between a target temperature and the temperature detected by the temperature detector; and
   a power controller configured to supply power, having one of a voltage and current controlled in accordance with the manipulated value, to the heater,
   wherein the calculator includes a first calculator having at least a proportional element of the proportional element, an integral element and a derivative element, a second calculator configured to calculate a square root, the first calculator and the second calculator being coupled in series with each other, a third calculator and a fourth calculator, and
   wherein the first calculator is configured to perform the calculation using the error as an input to generate a first manipulated value, the second calculator is configured to calculate a square root of the first manipulated value to generate a second manipulated value, the third calculator is configured to compare a reference voltage and a voltage supplied to the power controller to generate a correction value, and the fourth calculator is configured to correct the second manipulated value based on the correction value and to generate the manipulated value.

2. The apparatus according to claim 1, wherein the third calculator is configured to calculate a ratio between the reference voltage and the voltage supplied to the power controller to generate the correction value.

3. A temperature regulating apparatus which regulates temperature, the apparatus comprising:
   a heater:
   a temperature detector configured to detect temperature;
   a calculator configured to calculate a manipulated value based on an error between a target temperature and the temperature detected by the temperature detector; and
   a power controller configured to supply power, having one of a voltage and current controlled in accordance with the manipulated value, to the heater,
   wherein the calculator includes a first calculator having at least a proportional element of the proportional element, an integral element, and a derivative element, a second calculator configured to calculate a square root, the first calculator and the second calculator being coupled in series with each other, a third calculator and a fourth calculator, and
   wherein the first calculator is configured to perform the calculation using the error as an input to generate a first manipulated value, the third calculator is configured to compare a reference voltage and a voltage supplied to the power controller to generate a correction value, the fourth calculator is configured to correct the first manipulated value based on the correction value to generate a second manipulated value, and the second calculator is configured to calculate a square root of the second manipulated value to generate the manipulated value.

4. The apparatus according to claim 3, wherein the third calculator is configured to calculate a square of a ratio between the reference voltage and the voltage supplied to the power controller to generate the correction value.

5. A temperature regulating apparatus which regulates temperature, the apparatus comprising:
   a heater:
   a temperature detector configured to detect temperature;
   a calculator configured to calculate a manipulated value based on an error between a target temperature and the temperature detected by the temperature detector; and
   a power controller including a thyristor and is configured to supply power, having one of a voltage and current controlled in accordance with the manipulated value, to the heater,
   wherein the calculator includes a first calculator having at least a proportional element of the proportional element, an integral element, and a derivative element, and a second calculator configured to calculate a square root, the first calculator and the second calculator being coupled in series with each other.

6. A temperature regulating apparatus which regulates temperature, the apparatus comprising:
   a heater configured to heat a fluid;
   a temperature detector configured to detect temperature;
   a calculator configured to calculate a manipulated value based on an error between a target temperature and the temperature detected by the temperature detector; and
   a power controller configured to supply power, having one of a voltage and current controlled in accordance with the manipulated value, to the heater,
   wherein the calculator includes a first calculator having at least a proportional element of the proportional element, an integral element and a derivative element, and a second calculator configured to calculate a square root, the first calculator and the second calculator being coupled in series with each other.

7. An exposure system comprising:
   an exposure apparatus configured to project a pattern of an original onto a substrate to expose the substrate; and
   a temperature regulating apparatus configured to regulate a temperature of the exposure apparatus,
   wherein the temperature regulating apparatus comprises:
      a heater;
      a temperature detector configured to detect temperature;
      a calculator configured to calculate a manipulated value based on an error between a target temperature and the temperature detected by the temperature detector; and
      a power controller configured to supply power, having one of a voltage and current controlled in accordance with the manipulated value, to the heater,
      wherein the calculator includes a first calculator having at least a proportional element of the proportional element, an integral element, and a derivative element, and a second calculator configured to calculate a square root, and the first calculator and the second calculator are coupled in series with each other.

8. A device manufacturing method comprising:
exposing a substrate by an exposure system; and
developing the substrate,
wherein the exposure system comprising:
an exposure apparatus configured to project a pattern of an original onto a substrate to expose the substrate; and
a temperature regulating apparatus configured to regulate a temperature of the exposure apparatus,
wherein the temperature regulating apparatus comprises:
   a heater;
   a temperature detector configured to detect temperature;
   a calculator configured to calculate a manipulated value based on an error between a target temperature and the temperature detected by the temperature detector; and
   a power controller configured to supply power, having one of a voltage and current controlled in accordance with the manipulated value, to the heater,
wherein the calculator includes a first calculator having at least a proportional element of the proportional element, an integral element, and a derivative element, and a second calculator configured to calculate a square root, and the first calculator and the second calculator are coupled in series with each other.

* * * * *